(12) United States Patent
Chang

(10) Patent No.: US 7,554,809 B2
(45) Date of Patent: Jun. 30, 2009

(54) HEATSINK ASSEMBLY STRUCTURE

(75) Inventor: Kai-Po Chang, Taipei (TW)

(73) Assignee: Inventec Corporation, Taipei (TW)

( * ) Notice: Subject to any disclaimer, the term of this patent is extended or adjusted under 35 U.S.C. 154(b) by 195 days.

(21) Appl. No.: 11/704,335

(22) Filed: Feb. 9, 2007

(65) Prior Publication Data

US 2008/0192439 A1  Aug. 14, 2008

(51) Int. Cl.
H05K 7/20 (2006.01)
F28F 7/00 (2006.01)
H01L 23/34 (2006.01)

(52) U.S. Cl. .................. 361/711; 361/704; 361/719; 165/185; 165/80.2; 174/16.1; 174/16.3; 257/718; 257/719

(58) Field of Classification Search .......... 361/704, 361/709, 711, 719; 165/185, 80.2; 174/16.1, 174/16.3; 257/718–719
See application file for complete search history.

(56) References Cited

U.S. PATENT DOCUMENTS 5,932,925 A * 8/1999 McIntyre .................... 257/719
6,008,989 A * 12/1999 Lee et al. .................... 361/704
6,724,632 B2 * 4/2004 Lee et al. .................... 361/719
7,310,229 B2 * 12/2007 Lee et al. .................... 361/697
7,321,492 B2 * 1/2008 Wang et al. ................. 361/709
7,375,963 B2 * 5/2008 Eckberg et al. ............. 361/704
2005/0117307 A1 * 6/2005 Tanaka ....................... 361/719

* cited by examiner

*Primary Examiner*—Jayprakash N Gandhi
*Assistant Examiner*—Zachary M Pape
(74) *Attorney, Agent, or Firm*—Rabin & Berdo, P.C.

(57) ABSTRACT

A heatsink assembly structure combined with a heat-generating element disposed on a circuit board is provided. The heatsink assembly structure includes a heat conducting plate and at least one spring plate. The heat conducting plate includes a pressing surface and an abutment surface. The spring plate includes at least one fixing section and a plurality of pressing sections extending from the fixing section. When the fixing section of the spring plate is fixed to the circuit board, each of the pressing sections applies a force to press the heat conducting plate towards the heat-generating element, so as to attach the abutment surface on the heat-generating element, and conduct heat generated by the heat-generating element to the heat conducting plate. Thus, a plurality of forces pressing the heat conducting plate downward is provided with a simple structure.

11 Claims, 7 Drawing Sheets

HEATSINK ASSEMBLY STRUCTURE

BACKGROUND OF THE INVENTION

1. Field of Invention

The present invention relates to a heatsink assembly structure, and more particularly to a heatsink assembly structure that is firmly attached to a heat-generating element and provides normal pressing forces with a simple combined structure.

2. Related Art

A chip unit providing operation and main control functions of a computer, e.g., a central processor unit (CPU), is a core of the computer, and is very important to the computer. The chip unit or another module such as the display chip module may generate a lot of heat when operating at high frequencies, so they are heat-generating elements of the computer. The high temperature is a potential risk leading to the breakdown of the computer system, and further causes the computer down or damage. Therefore, heatsink devices are proposed to solve the aforementioned problem. The current heatsink method that has been widely applied uses a heatsink device fixed to the mainboard of the computer to dissipate heat. According to the conventional fixing technology, four holes corresponding to the heat-generating element are formed in the mainboard at the position where the heatsink device is fixed, so as to provide four normal forces. Thus, the heatsink device is attached and firmly fixed to the heat-generating element.

However, along with the trend of miniaturization of notebook computers, the mainboards are becoming smaller accordingly. Therefore, to a heatsink device, the position and number of the fixing holes are also limited. In particular, to a chip unit, the preferred fixing method is to open several holes at corners around the chip unit. When the above method is not applicable, fewer holes (e.g., three holes) must be used to firmly fix the heatsink device, which causes troubles.

In order to solve the problem that the heatsink device cannot be fixed to the mainboard with fewer holes in the conventional art, it is an object for the inventor of the present invention to redesign a heatsink assembly structure meeting the current trend of being light in weight and small in size of notebook computers and capable of providing normal forces with fewer holes than the conventional art so as to firmly fix the heatsink device to the mainboard.

SUMMARY OF THE INVENTION

In view of the aforementioned problem of the conventional art, the present invention provides a heatsink assembly structure to solve the problem that a heatsink device cannot be fixed to a mainboard with fewer holes in the conventional art, and to solve the problem how to firmly fix the heatsink device with three holes.

In order to achieve the aforementioned object, the present invention provides a heatsink assembly structure combined with a heat-generating element that is disposed on a circuit board. The heatsink assembly structure comprises a heat conducting plate and at least one spring plate. The heat conducting plate further includes a pressing surface and an abutment surface. The spring plate includes at least one fixing section and a plurality of pressing sections extending from the fixing section. When the fixing section is fixed to the circuit board, each of the pressing sections applies a force to press the heat conducting plate towards the heat-generating element, so as to attach the abutment surface on the heat-generating element, and conduct heat generated by the heat-generating element to the heat conducting plate.

The present invention provides a heatsink assembly structure, which has the following significant functional effect as compared with the conventional art.

The heatsink assembly structure of the present invention combines components such as a heat conducting plate and a spring plate easily, and provides normal pressing forces with fewer fixing points, for example, three screw fixing points. Thus, the heat conducting plate can be firmly attached to the heat-generating element to conduct heat. The present invention is suitable for current circuit boards with limited space that does not allow more screw fixing holes, and is in conformity with the trend that notebook computers are manufactured smaller and smaller. Furthermore, the heatsink assembly includes a stop member for limiting the spring plate, and providing pressing forces that enables the heat conducting plate to be attached on the heat-generating element more tightly.

To make the objectives, structure, features, and functions of the present invention more understandable, the present invention is illustrated below in detail with reference to the embodiments and the accompanying drawings.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

Figure 1A:
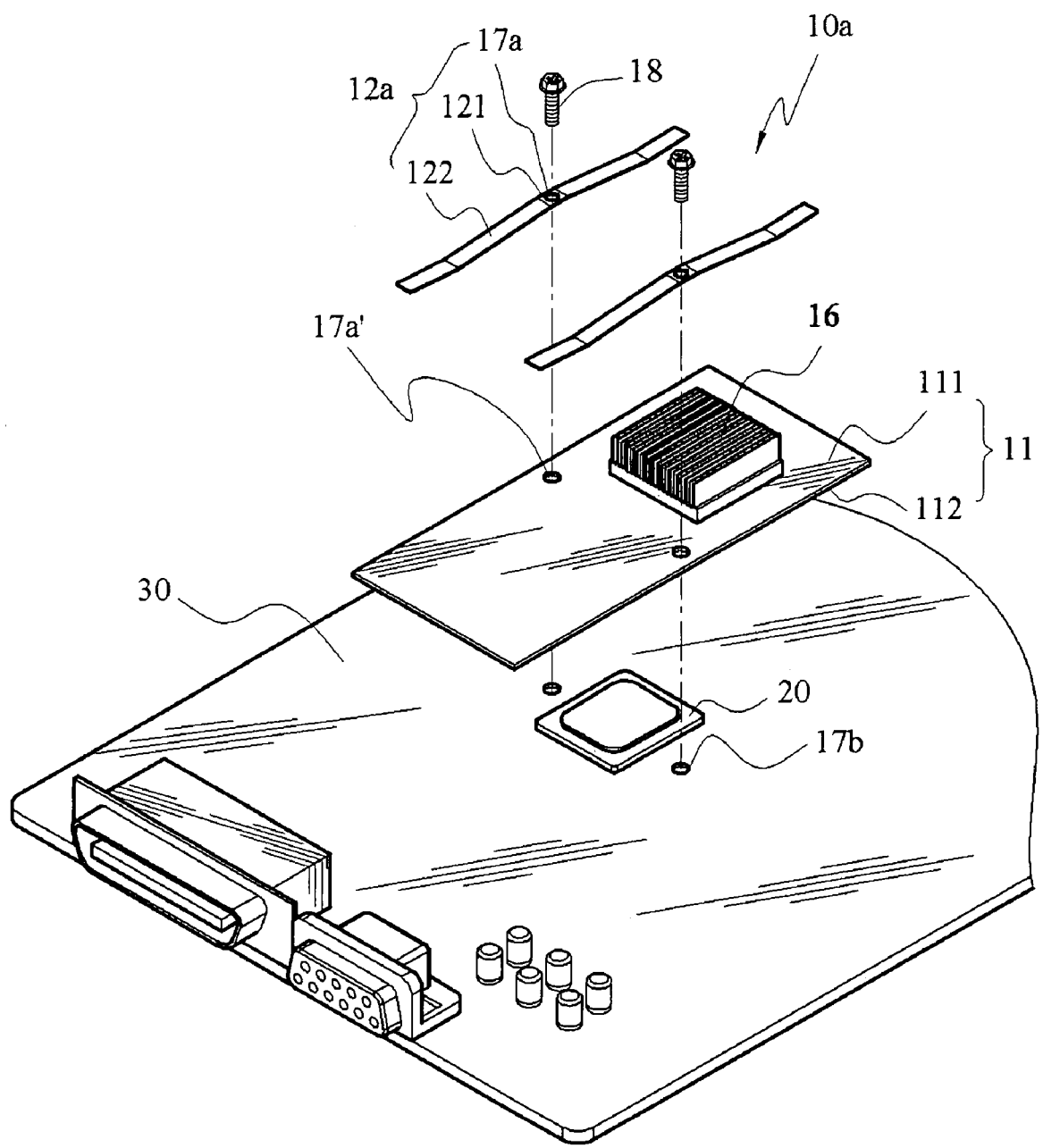
FIG. 1A is a schematic view of the heatsink assembly structure according to a first embodiment of the present invention.

Referring to FIG. 1A, the heatsink assembly structure of the present invention is disposed on a heat-generating element 20 for conducting the heat generated when the heat-generating element 20 operates. The heat-generating element 20 is disposed on a circuit board 30. The heat-generating element 20 is a chip, such as a CPU or a display chip, which generates a lot of heat in operation. The generated heat must be dissipated effectively to maintain the stable operation of the heat-generating element 20. Moreover, the heatsink assembly structure 10a includes a heat conducting plate 11 and at least one spring plate 12a. The heat conducting plate 11 includes a pressing surface 111 and an abutment surface 112. The abutment surface 112 is attached to the heat-generating element 20, so as to conduct the heat to the heat conducting plate 11. The spring plate 12a includes at least one fixing section 121 and a plurality of pressing sections 122 extending from the fixing section 121, and the fixing section 121 is fixed on the circuit board 30.

Figure 1B:
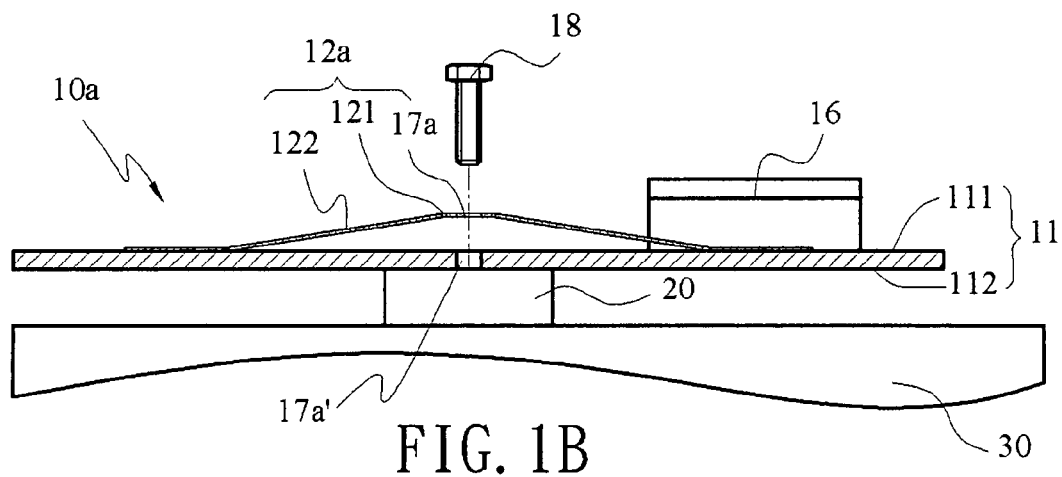
FIGS. 1B and 1C are schematic views of the actuation of the heatsink assembly structure according to the first embodiment of the present invention.
Figure 1C:
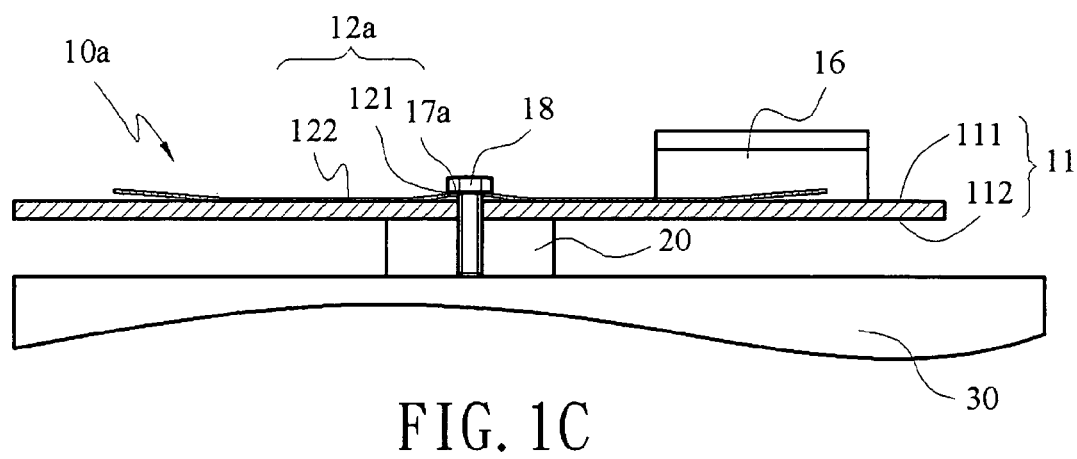

In the first embodiment of the present invention, it is disclosed in detail that the spring plate 12a includes at least two pressing sections 122, with two ends being fixed to the pressing surface 111 of the heat conducting plate 11 respectively. The two pressing sections 122 are symmetric about the fixing section 121, and extend in opposite directions. Moreover, the pressing sections 122 are further symmetrically disposed on two sides of the heat-generating element 20, and are arranged in a straight line. Therefore, when the spring plate 12a is fixed on the circuit board 30 with the fixing section 121, as shown in this embodiment, a through hole 17a is formed in the fixing section 121 of the spring plate 12a, another through hole 17a' is formed in the heat conducting plate 11 at a position corresponding to the through hole 17a, and a screw hole 17b is formed in the circuit board 30 at a position corresponding to the through hole 17a. A screw 18 is used for screwing the spring plate 12a to the circuit board 30. As shown in FIGS. 1B and 1C, the pressing sections 122 slide to be flatly attached to the heat conducting plate 11, such that each of the pressing sections 122 applies a force to press the heat conducting plate 11 towards the heat-generating element 20. Thus, the heat conducting plate 11 is attached on the heat-generating element 20 tightly, and the arched spring plate 12a is fixed on the pressing surface 111 of the heat conducting plate 11.

Figure 2A:
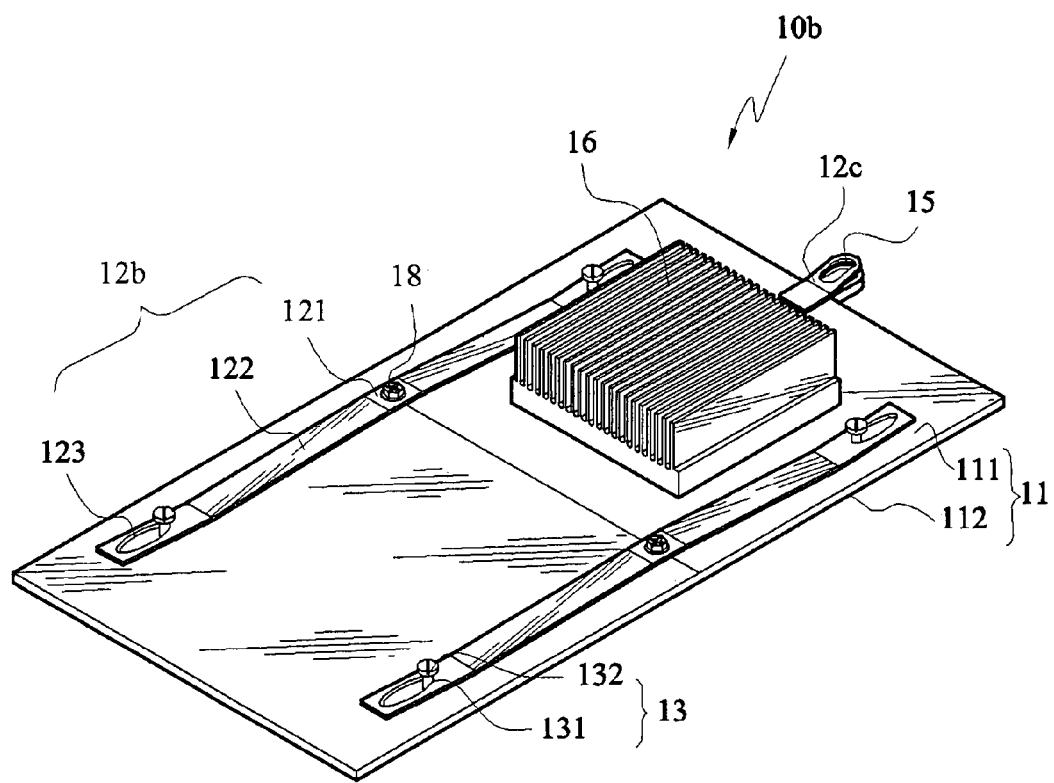
FIG. 2A is a schematic view of the heatsink assembly structure according to a second embodiment of the present invention.
Figure 2B:
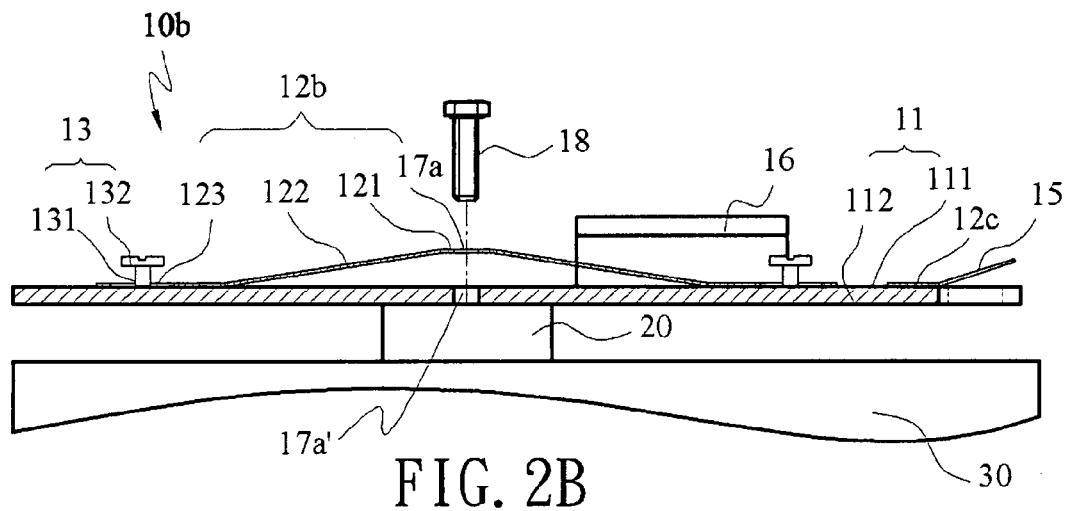
FIGS. 2B and 2C are schematic views of the actuation of the heatsink assembly structure according to the second embodiment of the present invention.
Figure 2C:
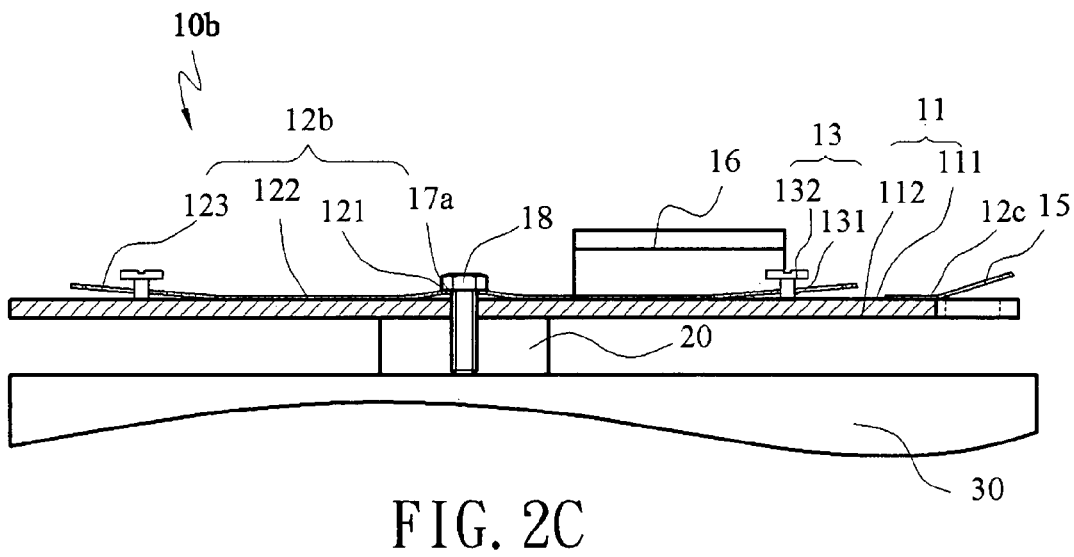
Figure 3:
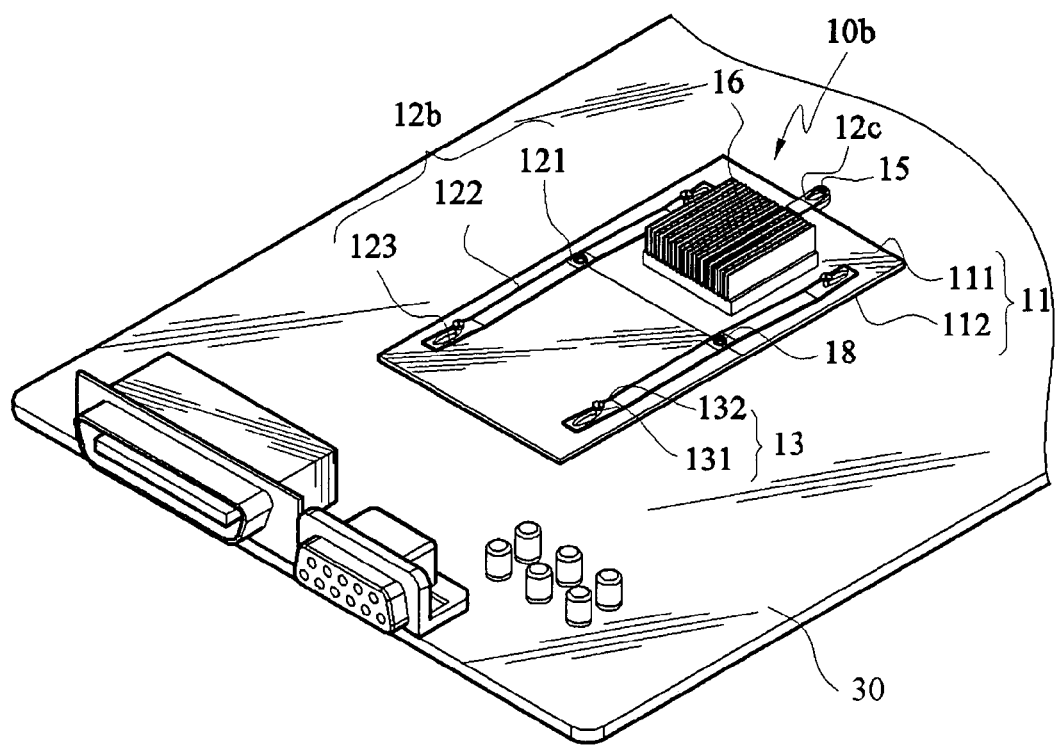
FIG. 3 is a schematic view of the heatsink assembly structure attached to a circuit board according to a third embodiment of the present invention.

Referring to FIG. 2A, the heatsink assembly structure 10b of the second embodiment of the present invention similar to that of the first embodiment also includes a heat conducting plate 11 and at least one spring plate 12b, but further includes at least one stop member 13. The stop member 13 is fixed to the heat conducting plate 11, and limits the moving path of the end of the spring plate 12b. The stop member 13 has a combining portion 131 and a cap portion 132 extending from the combining portion 131. The combining portion 131 of the stop member 13 is fixed on the pressing surface 111 of the heat conducting plate 11. In this embodiment, when the stop member 13 is a rivet, the combining portion 131 is the rivet stud fixed to the pressing surface 111 of the heat conducting plate 11, and the cap portion 132 is the rivet head extending from the rivet stud. Moreover, a slot hole 123 is formed at the end of the spring plate 12b for disposing the stop member 13. The stop member 13 can be, but is not limited to, a T-shaped rivet. When the rivet is fixed in the slot hole 123, the moving path of the ends of the spring plate 12a can be limited. Definitely, the stop member 13 can also be a screw, as shown in FIGS. 2B and 2C. Similarly, when the spring plate 12a is fixed to the circuit board 30, each of the pressing sections 122 applies a force to press the heat conducting plate 11 towards the heat-generating element 20. When the fixing section 121 of the spring plate 12a gets closer to the heat conducting plate 11, the end of the pressing sections 122 tilts. At this time, the pressing sections 122 urges against the cap portion 132, so as to prevent the end of the spring plate 12b from tilting. Thus, the heat conducting plate 11 is closely attached to the heat-generating element 20, as shown in FIG. 3.

Figure 4:
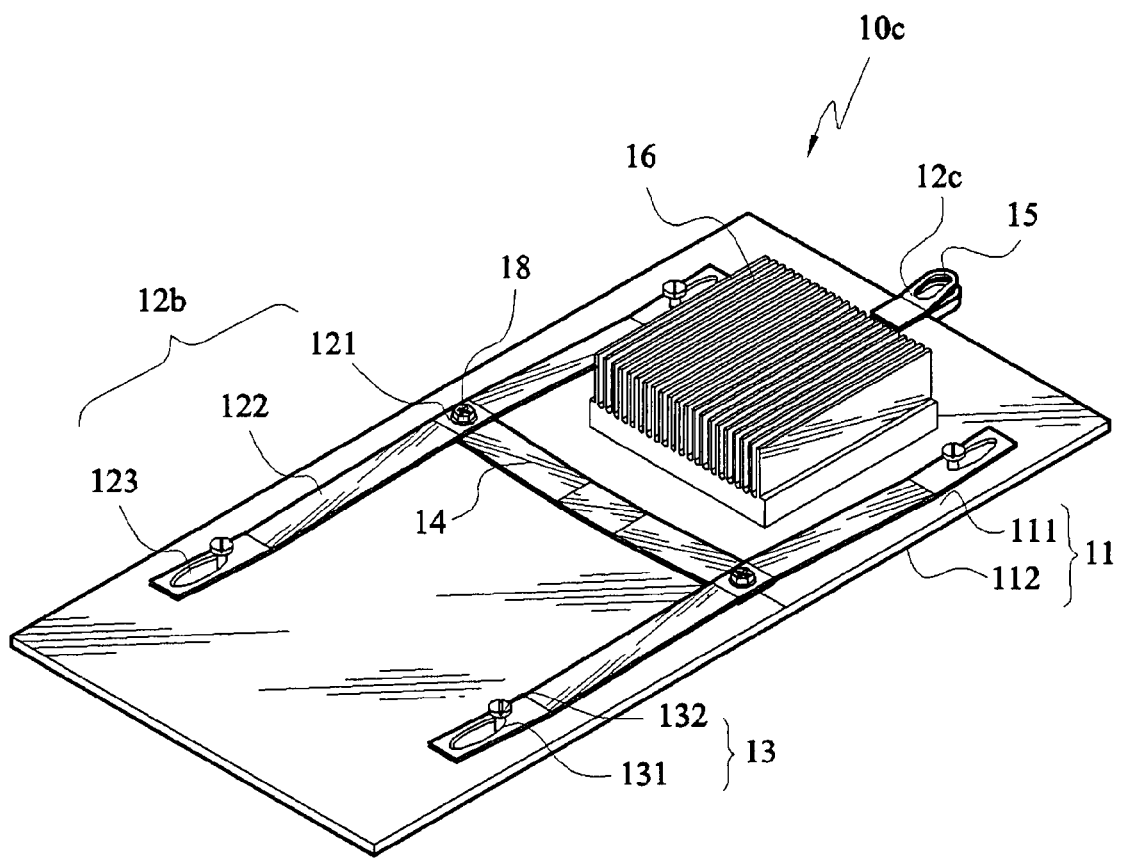
FIG. 4 is a schematic view of the heatsink assembly structure according to the third embodiment of the present invention.

Referring to FIG. 4, the heatsink assembly structure 10c of the third embodiment of the present invention similar to that of the second embodiment also includes a heat conducting plate 11, at least one spring plate 12b, and a stop member 13, but further includes a pressing spring plate 14. The pressing spring plate 14 spans over the fixing sections 121 of the two spring plates 12b. When the two spring plates 12b are fixed to the circuit board 30, the pressing spring plate 14 is driven to act, and generates pull forces towards the circuit board 30 at the same time, so as to press the heat conducting plate 11 against the heat-generating element 20. Definitely, the stop member 13 can also be omitted in the third embodiment, and the heat conducting plate 11 can still be attached to the heat-generating element 20 closely.

In addition, a fixing hole 15 can further be formed in the heat conducting plate 11 of the heatsink assembly structure 10a, 10b, or 10c. The fixing hole 15 is at one end of the heat conducting plate 11, allowing one end of the heat conducting plate 11 to be fixed to the circuit board 30, so as to provide the pressing force to attach the heat conducting plate 11 to the heat-generating element 20 closely. Another spring plate 12c is added on the fixing hole 15. The spring plate 12c includes a fixing section 121 and a pressing section 122 extending from the fixing section 121. Therefore, when the heat conducting plate 11 is fixed on the circuit board 30, the spring plate 12c generates a pressing force towards the circuit board 30, so as to push the heat conducting plate 11 against the heat-generating element 20.

The heatsink assembly structure 10a, 10b, or 10c further comprises a heatsink module 16 disposed on the heat conducting plate 11, so as to dissipate the heat conducted by the heat conducting plate.

Figure 5A:
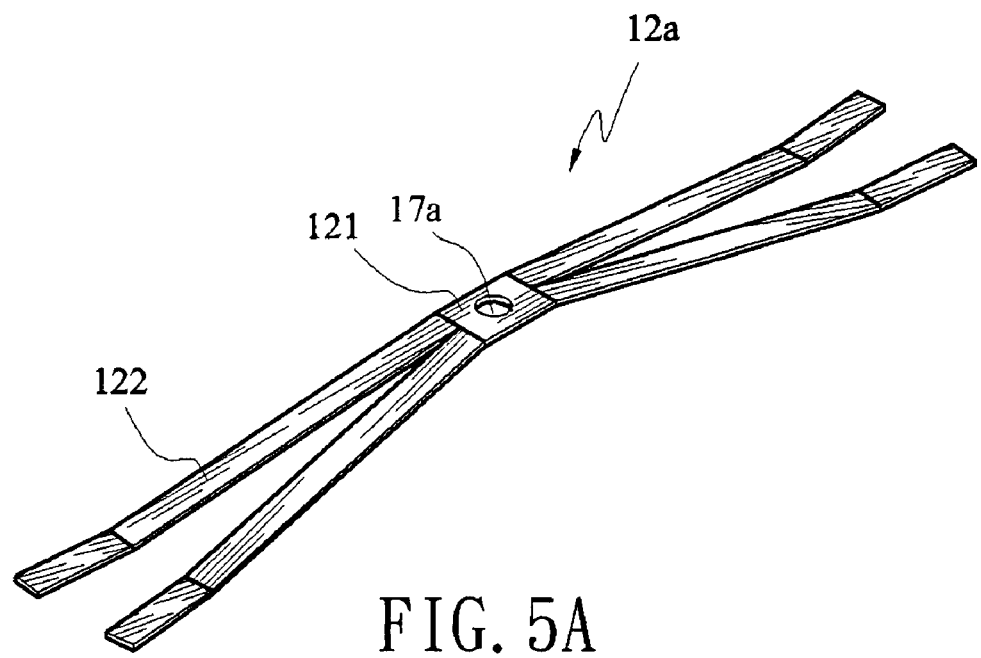
FIGS. 5A and 5B are schematic views of a spring plate having four pressing sections of the heatsink assembly structure of the present invention.
Figure 5B:
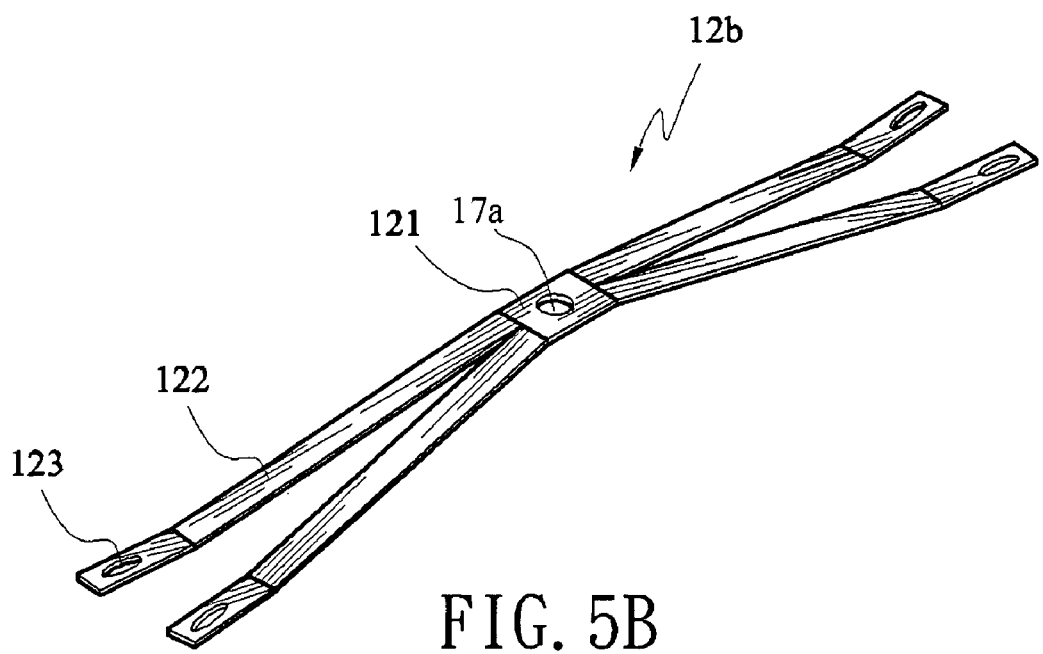

Furthermore, the structure of the spring plate 12a can include a plurality of pressing sections 122, e.g., four pressing sections 122, as shown in FIG. 5A. Definitely, the spring plate 12b can also include, for example, four pressing sections 122, as shown in FIG. 5B, and the method for assembling the four pressing sections 122 on the heat conducting plate 11 and the actuation to press against the heat-generating element 20 are the same as the aforementioned embodiments.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A heatsink assembly structure combined with a heat-generating element, wherein the heat-generating element generates heat and is disposed on a circuit board, the heatsink assembly structure comprising:
   a rectangular heat conducting plate, comprising a pressing surface and an abutment surface, wherein the abutment surface is attached on the heat-generating element to conduct the heat to the heat conducting plate; and
   two spring plates, each with elongated length-wise edges which are parallel to the elongated length-wise edges of the rectangular heat conducting plate, and each comprising at least one fixing section and a plurality of pressing sections extending from the fixing section, wherein the fixing section is fixed to the circuit board, such that each of the pressing sections applies a force to press the heat conducting plate towards the heat-generating element, wherein each spring plate further comprises a slot hole formed at the end of the spring plate; and
   at least one stop member, wherein the stop member is a rivet that is fixed in a respective slot hole and to the heat conducting plate, so as to limit a moving path of an end of a respective spring plate.

2. The heatsink assembly structure as claimed in claim 1, wherein the plurality of pressing sections are symmetric about the fixing section, and extend in opposite directions.

3. The heatsink assembly structure as claimed in claim 1, wherein the heat conducting plate further has a fixing hole formed at one end of the heat conducting plate for fixing the end of the heat conducting plate to the circuit board.

4. The heatsink assembly structure as claimed in claim 3, wherein another spring plate is added on the fixing hole, and the spring plate comprises a fixing section and a pressing section extending from the fixing section, when the heat conducting plate is fixed to the circuit board, the spring plate applies a pressing force towards the circuit board, so as to push the heat conducting plate against the heat-generating element.

5. The heatsink assembly structure as claimed in claim 1, further comprising a heatsink module disposed on the heat conducting plate for dissipating the heat conducted by the heat conducting plate.

6. The heatsink assembly structure as claimed in claim 1, wherein the fixing section of the spring plates are screwed on the circuit board.

7. The heatsink assembly structure as claimed in claim 1, wherein each stop member has a combining portion and a cap portion extending from the combining portion, and the combining portion of the stop member is fixed on the abutment surface of the heat conducting plate, when the fixing section is fixed to the circuit board, the cap portion is pressed against the respective spring plate, so as to prevent the end of the spring plate from tilting.

8. The heatsink assembly structure as claimed in claim 1, wherein the rivet is T-shaped.

9. The heatsink assembly structure as claimed in claim 1, wherein each spring plate is fixed to the pressing surface of the heat conducting plate in an arch shape.

10. A heatsink assembly structure combined with a heat-generating element, wherein the heat-generating element generates heat and is disposed on a circuit board, the heatsink assembly structure comprising:
  a heat conducting plate, comprising a pressing surface and an abutment surface, wherein the abutment surface is attached on the heat-generating element to conduct the heat to the heat conducting plate;
  a fixing hole, formed at one end of the heat conducting plate, for fixing the end of the heat conducting plate to the circuit board, wherein another spring plate is added on the fixing hole, and the spring plate comprises a fixing section and a pressing section extending from the fixing section;
  a heatsink module, disposed on the heat conducting plate, for dissipating the heat conducted by the heat conducting plate;
  two spring plates, respectively comprising at least one fixing section and a plurality of pressing sections extending in an opposite direction of the fixing section, wherein the pressing sections are symmetric about the fixing section, the fixing section is screwed on the circuit board, such that each of the pressing sections applies a force to press the heat conducting plate towards the heat-generating element, and a slot hole is formed at an end of the spring plate;
  at least one stop member, wherein the stop member is a T-shaped screw or a rivet, fixed to the heat conducting plate, and limiting a moving path of the end of the spring plate, the slot hole is used for disposing the stop member so as to limit the moving path of the end of the spring plate, and the stop member further comprises a combining portion and a cap portion extending from the combining portion, the combining portion of the stop member is fixed on the abutment surface of the heat conducting plate, when the fixing section is fixed on the circuit board, the cap portion is pressed against the spring plate, so as to prevent the end of the spring plate from tilting; and
  a pressing spring plate, spanning over the fixing sections of the two spring plates, wherein when the spring plates are fixed to the circuit board, the pressing spring plate acts, and generates pull forces towards the circuit board at a same time, so as to press the heat conducting plate against the heat-generating element.

11. A heatsink assembly structure combined with a heat-generating element, wherein the heat-generating element generates heat and is disposed on a circuit board, the heatsink assembly structure comprising:
  a heat conducting plate, comprising a pressing surface and an abutment surface, wherein the abutment surface is attached on the heat-generating element to conduct the heat to the heat conducting plate; and
  two spring plates, fixed on the pressing surface of the heat conducting plate and arranged symmetrically on two sides of the heat-generating element, and being arranged in a straight line, each of the two spring plates comprising at least one fixing section and a plurality of pressing sections extending from the fixing section, wherein the fixing section is fixed to the circuit board, such that each of the pressing sections applies a force to press the heat conducting plate towards the heat-generating element; and
  a pressing spring plate that spans over the fixing sections of the two spring plates when the two spring plates are fixed to the circuit board, the pressing spring plate acts accordingly so as to generate pull forces towards the circuit board at a same time to push the heat conducting plate against the heat-generating element.

* * * * *